United States Patent [19]

Berger et al.

[11] Patent Number: 5,119,531
[45] Date of Patent: Jun. 9, 1992

[54] SYSTEM FOR JOINING BY INTERENGAGEMENT COMPRISING INTERENGAGING ELEMENTS FORMED BY RIDGES WITH ELASTICALLY DEFORMABLE LIPS, IN PARTICULAR CURVILINEAR

[76] Inventors: Michel Berger, 104, La Lande Sainte-Hélène, 33480 Castelnau-de-Medoc; Hélie De Pourtales, 40, rue du Bac, 75007 Paris; Hubert Perrodo, 6, rue des Marronniers, 75016 Paris; Hélie De Noailles, 4, rue de Tournon, 75006 Paris, all of France

[21] Appl. No.: 766,954

[22] Filed: Sep. 25, 1991

Related U.S. Application Data

[63] Continuation of Ser. No. 439,039, Oct. 23, 1989, abandoned.

[30] Foreign Application Priority Data

Feb. 26, 1988 [FR] France ................................ 8802389
Sep. 22, 1988 [FR] France ................................ 8812399

[51] Int. Cl.⁵ .............................................. F16B 5/07
[52] U.S. Cl. ........................................ 24/576; 24/452
[58] Field of Search .................. 24/575, 576, 577, 442, 24/452, 587, 399, 400; 583/63, 65

[56] References Cited

U.S. PATENT DOCUMENTS

| | | | |
|---|---|---|---|
| 3,160,329 | 12/1974 | Weisberg | 24/577 X |
| 3,192,589 | 7/1965 | Pearson | |
| 3,266,113 | 8/1966 | Flanagan, Jr. | 24/452 |
| 3,325,084 | 6/1967 | Ausnit | 24/576 X |
| 3,557,413 | 1/1971 | Engle | 24/576 |
| 3,586,220 | 6/1971 | Reinsberg | 24/576 |
| 4,707,231 | 11/1987 | Berger | |

FOREIGN PATENT DOCUMENTS

| | | |
|---|---|---|
| 0035652 | 9/1981 | European Pat. Off. . |
| 0037652 | 6/1984 | European Pat. Off. . |
| 0250175 | 12/1987 | European Pat. Off. . |
| 1784067 | 7/1971 | Fed. Rep. of Germany . |
| 2223943 | 12/1973 | Fed. Rep. of Germany . |
| 2504863 | 8/1976 | Fed. Rep. of Germany . |
| 2101195 | 3/1972 | France . |
| 2196131 | 3/1974 | France . |
| 2435221 | 4/1980 | France . |
| 2450282 | 9/1980 | France . |
| 2592404 | 12/1985 | France . |
| 2570646 | 11/1987 | France . |
| 800169 | 8/1958 | United Kingdom ................. 24/576 |

*Primary Examiner*—James R. Brittain
*Attorney, Agent, or Firm*—Rosen, Dainow & Jacobs

[57] ABSTRACT

A system of joining by interengagement, especially suitable for fasteners by interengagement, comprising a first joining device conventionally in the form of a tape, provided on a first interengagement face with a plurality of first interengagement elements which are at least partially elastically deformable, and a second joining device likewise conventionally in the form of a tape, provided on a second interengagement face with the plurality of second interengaging elements which are at least partially elastically deformable, wherein the elements are formed with ridges that interengage.

20 Claims, 6 Drawing Sheets

SYSTEM FOR JOINING BY INTERENGAGEMENT COMPRISING INTERENGAGING ELEMENTS FORMED BY RIDGES WITH ELASTICALLY DEFORMABLE LIPS, IN PARTICULAR CURVILINEAR

This application is a continuation of application Ser. No. 07/439,039, filed Oct. 23, 1989, abandoned.

The present invention essentially relates to a system for joining by interengagement comprising interengaging elements formed by ridges with elastically deformable lips, in particular curvilinear.

Systems for joining by interengagement, particularly for fasteners by interlocking, are well-known. The most well known is the so-called "Velcro" system of interlocking.

By way of examples of such devices, document FR-A-2 101 195 may be cited. Described therein is a system of joining by interengagement comprising a first joining device (1) conventionally in the form of a tape (3), provided on one so-called interengagement face with a plurality of first interengaging elements (5, 6) which are at least partly elastically deformable, and a second joining device likewise conventionally in the form of a tape (3), provided on a so-called interengaging face with a plurality of second interengaging elements (5, 6) which are at least partly elastically deformable, allowing, upon a relative approach of said first and second devices with their interengaging elements (5, 6) opposite one another, the interengagement of the second interengaging elements with the first interengaging elements by elastic deformation of the first and second interengagement means. In this document, the first interengaging elements (5, 6) and the second interengaging elements are of identical shape, thus procuring a complete symmetry of the first and second joining devices.

In this document, as in all the joining devices of the so-called "Velcro" type, at least the interengaging elements of one of the two joining devices are constituted by male elements of filiform type obtained by cutting out closed loops (2, 4) (FIG. 3) or (22 to 25) (FIG. 4) of FR-A-2 101 195.

The process for manufacturing such tapes or ribbons for device for fasteners by interengagement is therefore complicated and extremely expensive.

Improvements have been made to such devices, described in documents FR-A-2 196 131; FR-A-2 435 221; FR-A-2 450 282; EP-A-0 037 652 or EP-A-0 250 175.

All these improvements complicate the process of manufacture by the use of filiform elements bent in U-form, embedded in the mass of a support which is made to be multi-layered.

In addition, such devices do not resist ageing and lose a large part of their performances as to their tear resistance, in the course of time, which is detrimental.

Furthermore, in the slide fastener technique, DE-A-2 223 943 and its Certificate of Addition DE-A-2 504 863 disclose rigid T-sectioned interengaging elements of which the elements penetrate into one another thanks to the suppleness of a support tape supporting the rigid interengaging elements. This system has been abandoned as the slide fastener technique is not usable within the scope of the systems of joining by interengagement of two tapes brought opposite each other. Likewise, in these documents, it is necessary, in order to avoid a lateral slide, to use a yarn (7) for fixation overlapping an intermediate piece (5) disposed between the coupling heads (4, 4'). The Certificate of Addition covers the additional use of a textile tape (3) incorporated in the supple support tape (2, 2').

The present invention therefore has for its object to overcome the above-mentioned drawbacks.

Thus, the present invention has for an object to solve the new technical problem consisting in providing a system of joining by interengagement which is extremely simple in order to be manufactured by an inexpensive process of manufacture.

The present invention also has for its object to solve the new technical problem consisting in providing a system of joining by interengagement whose interengaging elements are not subjected to an effect of ageing but conserve, on the contrary, their initial performances in the course of time, and in particular after several joinings and disassemblies.

The present invention also has for an object to solve the new technical problem consisting in providing a system of joining by interengagement which presents a resistance to disengagement, i.e. to the separation of the joining devices, much greater than the resistance to disassembly of the prior known systems of joining by interengagement.

The present invention further has for an object to solve the new technical problem consisting in providing a system of joining by interengagement which may be manufactured by a process of extrusion.

All these new technical problems are solved for the first time by the present invention in extremely simple manner, at an extremely reduced cost, allowing use on an industrial scale in a multiplicity of technical domains, whether it be for making closures, particularly of the zip or "Velcro" type, for making a suspended interengagement system from which may be suspended objects presenting a certain weight, as well as in the aeronautical domain.

Thus, according to the present invention, a system of joining by interengagement, particularly for fasteners by interengagement, is provided, comprising a first joining device conventionally in the form of a tape, provided on a so-called interengagement face with a plurality of first interengaging elements which are at least partly elastically deformable, and a second joining device likewise conventionally in the form of a tape, provided on a socalled interengagement face with a plurality of second interengaging elements which are at least partly elastically deformable, allowing, upon a relative approach of said first and second joining devices with their interengaging elements opposite one another, the interengagement of the second interengaging elements with the first interengaging elements by elastic deformation of the first and second interengaging elements, characterized in that the first interengaging elements and the second interengaging elements are formed by ridges provided with elastically deformable lips projecting on either side of the ridge to define between the lips of two successive ridges, contractions or gaps between the ridges narrower than the projection of the lips of a given ridge.

These ridges are advantageously discontinuous and are disposed either in line, are offset or in quincunx.

In the case of the ridges being discontinuous, the ridges are separated by notches whose dimension is smaller than the length of the ridge.

According to a variant, the first interengaging elements and the second interengaging elements being of identical shape, procure a complete symmetry of the first joining device and of the second joining device.

According to a particular embodiment, the ridges are disposed transversely with respect to the tape forming each joining device.

These ridges are advantageously disposed substantially parallel to one another and substantially perpendicularly to the interengagement device on which they are formed.

According to a first variant embodiment, the ridges with their lips are T-shaped in cross section, the angle of the arms of the T with the leg of the T being able to vary within broad limits, being at the most equal to about 90°. The angle of 90° constitutes an advantageous embodiment, as well as an angle smaller than about 60 or 45°.

According to another variant embodiment, the ridges with their lips have a mushroom-shaped cross section.

These joining devices according to the invention with their interengaging elements in the form of ridges provided with lips may be made of any material, and in particular of composite material. Examples of appropriate composite materials are those described in prior Application FR-85 19436, which is here incorporated by reference, and which describes composite materials reinforced with fibers oriented tridimensionally. These fibers woven in three dimensions may be selected in particular from silicon carbide, a mixture of silicon carbide and titanium, boron, carbon, whilst the matrix may advantageously be made of silicon carbide, graphite, or carbon or even zirconium oxide. Composite materials comprising fibers woven in two dimensions may also be used, these fibers being selected in particular from the group consisting of silicon carbide, zirconium, alumina or mixtures of aluminium oxide and silicon oxide. The matrix in which these fibers bathe is advantageously selected from the group consisting of zirconium, alumina or mixtures of aluminium and silicon oxide. In this case of fibers oriented bidimensionally, the composite material may be prepared in accordance with the process described in the prior Application FR-84 14800, equivalent to US-A-4 707 231, which is likewise incorporated here by reference.

Such a system of joining by interengagement according to the invention may be prepared in extremely simple, inexpensive manner by a process by extrusion.

Another likewise very inexpensive process for manufacturing each joining device for forming the system of joining, is characterized in that substantially parallel folds are made in two tapes with the aid of two appropriate folding means, these two tapes are disposed at a predetermined distance from each other with the respective folds opposite, but offset, the two tapes are approached until the edges of the folds of one tape are in contact with the other tape, the edges of the folds are connected with the tape with which they are in contact, and cut-outs are made between the folds of one of the two tapes.

According to a variant embodiment of this process, another tape forming support is connected on the tape opposite the one comprising the cut-outs or intended to bear the cut-outs, for example a weave.

According to a particular embodiment, the folds comprise successive sections of which at least certain are offset by a half-pitch.

According to another advantageous embodiment of the process according to the invention, the tapes are continuous tapes, with the result that the process is carried out continuously by continuous unrolling of each tape which may then be cut to the desired length.

These tapes may be made of any material, particularly of plastics material, which allows folding when hot, or of composite material.

All the determining technical advantages previously set forth are thus obtained. Such a system of joining according to the invention may be manufactured at extremely low cost, with extreme ease, of any material, with the result that the possible uses of this system of joining are virtually limitless. In particular, uses for making closures, particularly of the zip or "Velcro" type, for making suspended interengagement systems from which various objects, even presenting a certain weight, may be hooked, thanks to their extreme resistance to pulling apart, may be cited.

It has been seen that, in the preceding embodiments, the ridges, with their lips, have a T-shaped cross section. The ridges are rectilinear and may be continuous or discontinuous. In order to avoid a longitudinal slide of the two joining devices in assembled position, it has been proposed, particularly with reference to FIG. 6, to make ridges 214a, 214b offset by a half-pitch.

The present invention further has for an object to bring various improvements to the system of joining by interengagement described hereinabove, making it possible to avoid a longitudinal slide of the two joining devices in assembled position, thanks to an extremely simple solution.

The present invention therefore has for an object to solve the new technical problem consisting in providing a system of joining by interengagement of the type described previously, avoiding a longitudinal slide, whilst being of a particularly simple design.

This new technical problem is solved for the first time by the present invention in satisfactory manner, usable on an industrial scale.

Thus, according to a first aspect, the present invention provides a system of joining by interengagement of the type described previously, characterized in that the ridges have a curvilinear section. In addition, the joining devices may be either of different structure or identical, particularly for facilitating interengagement.

According to a particular embodiment, the ridges have an arcuate section, these ridges thus being concentric to one another.

According to another embodiment of the invention, the ridges have a sinusoidal section.

Naturally, according to a variant, the ridges may be discontinuous and, in that case, they are preferably aligned and separated by notches whose dimension is smaller than the length of the ridges.

According to another embodiment of the invention, the ridges are continuous.

The ridges with their lips are T-shaped in cross section, the lips forming with the ridges an angle at the most equal to about 90°.

According to another particularly advantageous characteristic of the invention, the ridges with their lips are made of a material selected from the group consisting of a metal, a plastics material, a composite material or an elastomer material or any extrudable or mouldable material.

According to a second aspect, the present invention also provides a process for manufacturing a joining device for system of joining, characterized in that two tapes of extrudable material are extruded with ridges of curvilinear section.

According to an advantageous embodiment, two tapes of extrudable material are extruded with ridges of sinusoidal section, thanks to the use of two extrusion dies comprising a fixed extrusion die and a mobile die animated by a reciprocating displacement in the direction perpendicular to the advance of the tape whilst the extrudable material is still soft.

It is thus ascertained that, thanks to the invention, any longitudinal slide of the two joining devices in assembled position is avoided, thanks to a particularly simple, inexpensive embodiment.

According to yet another improvement to the joining system mentioned above, the ratio in percentage of the thickness of the lips to the thickness of the ridges is included between 20-30 and 70-80, preferably between 20-30 and 60-70.

According to another likewise advantageous variant embodiment, the general section of the lips of a given ridge is curved in the direction of the ridge, thus procuring a so-called mushroom section.

According to yet another advantageous characteristic of the invention, the end of the lips mentioned above comprises a nose curved towards the ridge or an inner excess thickness serving as point of resistance against disassembly.

Other objects, characteristics and advantages of the invention will clearly appear in the light of the explanatory description which follows, made with reference to the accompanying drawings representing several presently preferred embodiments of the invention given simply by way of illustration and which in no way could limit the scope of the invention.

Figure 4A:
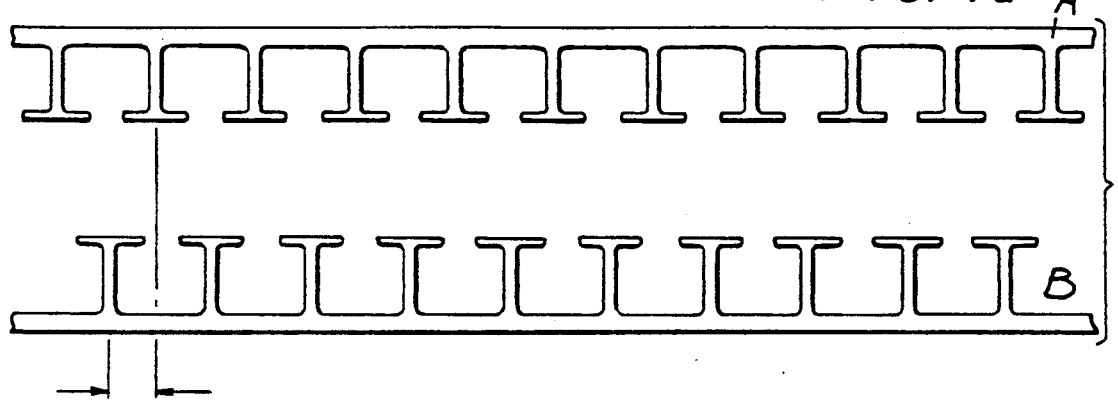
Figure 4B:
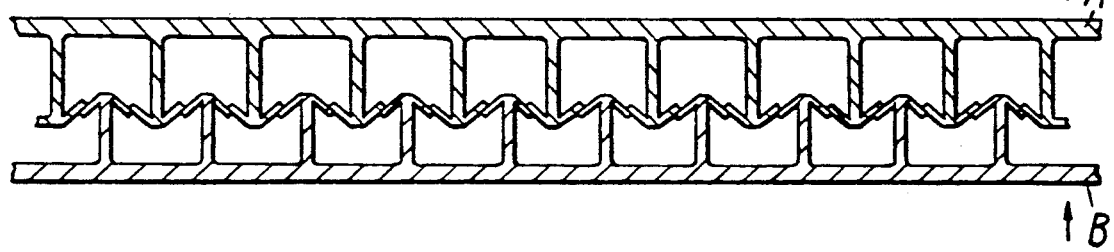
Figure 4C:
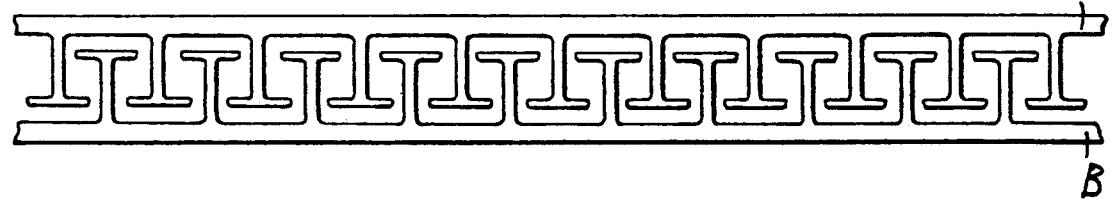
Figure 4D:
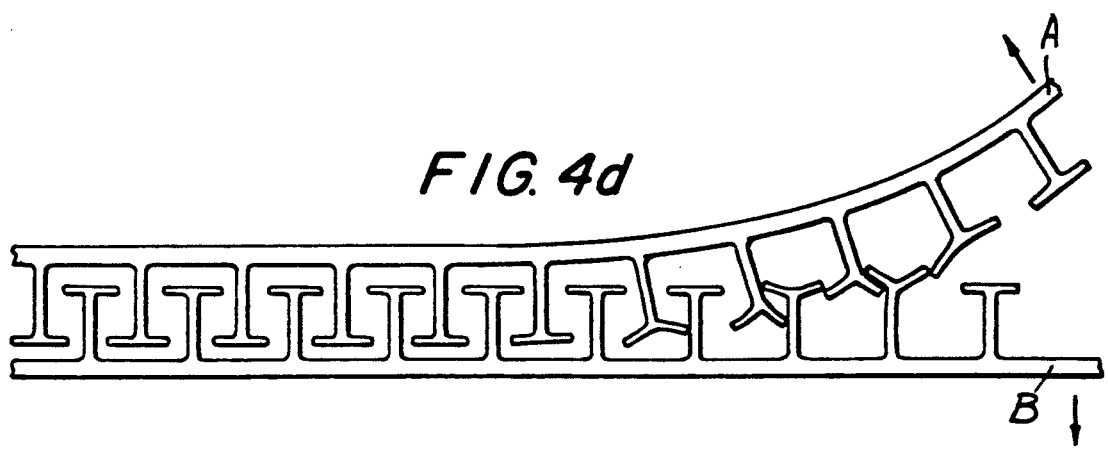

FIGS. 4a to 4d represent the process of joining and of disassembly of the joining system according to the invention; FIG. 4a showing each of the two joining devices according to the invention in accordance with the embodiment of FIG. 1, in position before assembly; FIG. 4b shows the intermediate position at the moment of interengagement; FIG. 4c shows the assembled position; and FIG. 4d represents the joining system in partially disassembled position, certain interengaging elements being disengaged or disassembled.

Figure 5A:
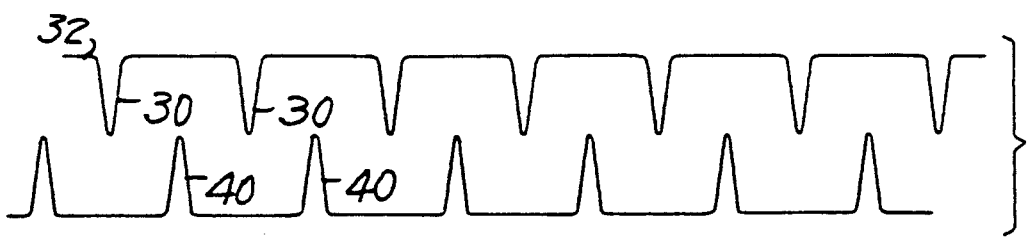
Figure 5B:
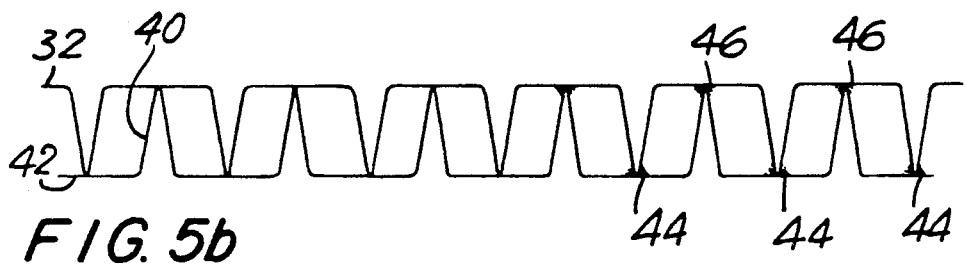
Figure 5C:
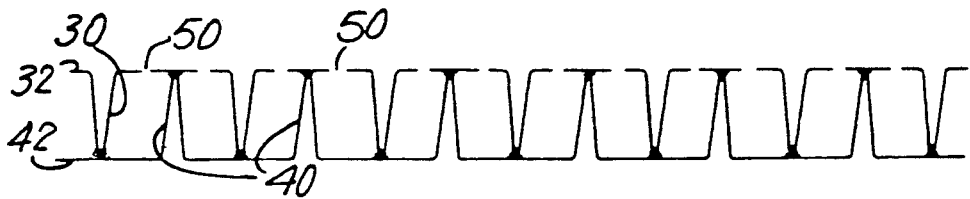
Figure 5D:
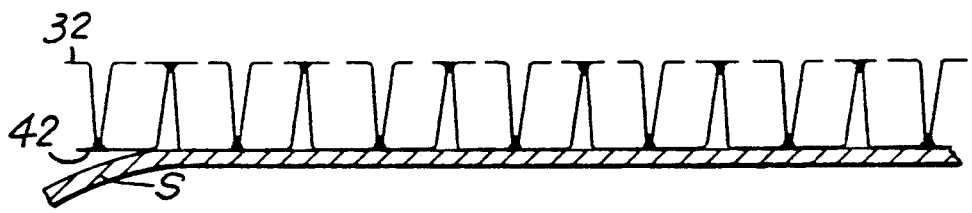
Figure 6:
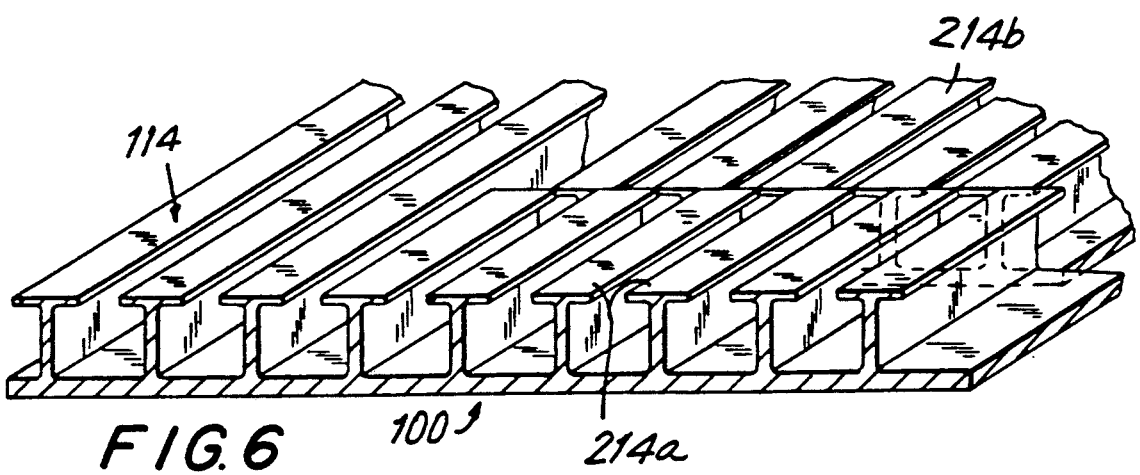

FIGS. 5a to 5d represent a process of manufacture according to the invention which will be described in detail hereinbelow; and FIG. 6 shows a fourth embodiment of a joining device according to the invention.

Figure 7:
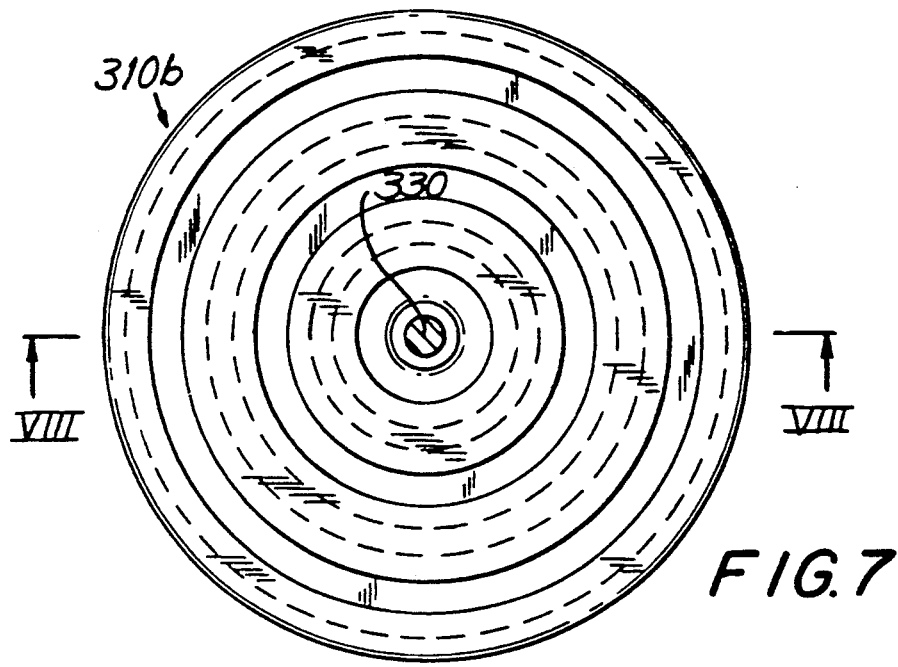
Figure 8:
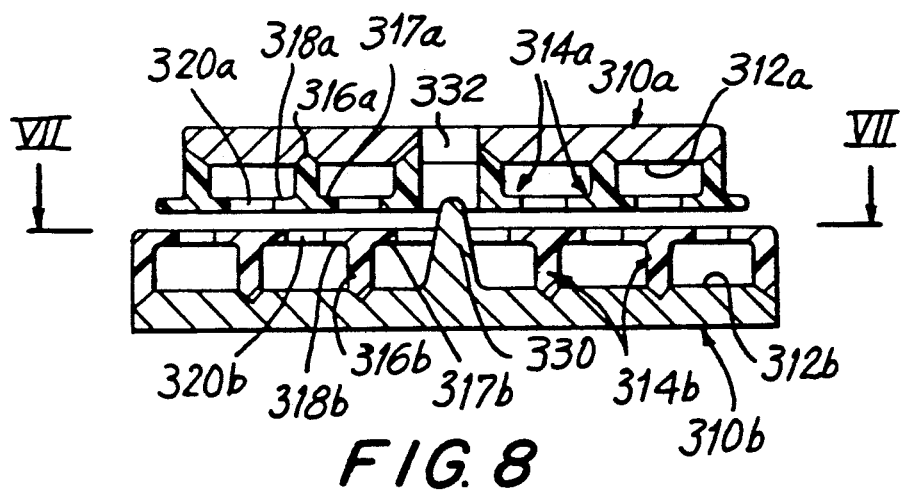

FIG. 7 shows a schematic view in section, along line of section VII—VII of FIG. 8, of a fifth embodiment of a joining system according to the present invention.

FIG. 8 shows a view in section along line VIII—VIII of FIG. 7.

Figure 9:
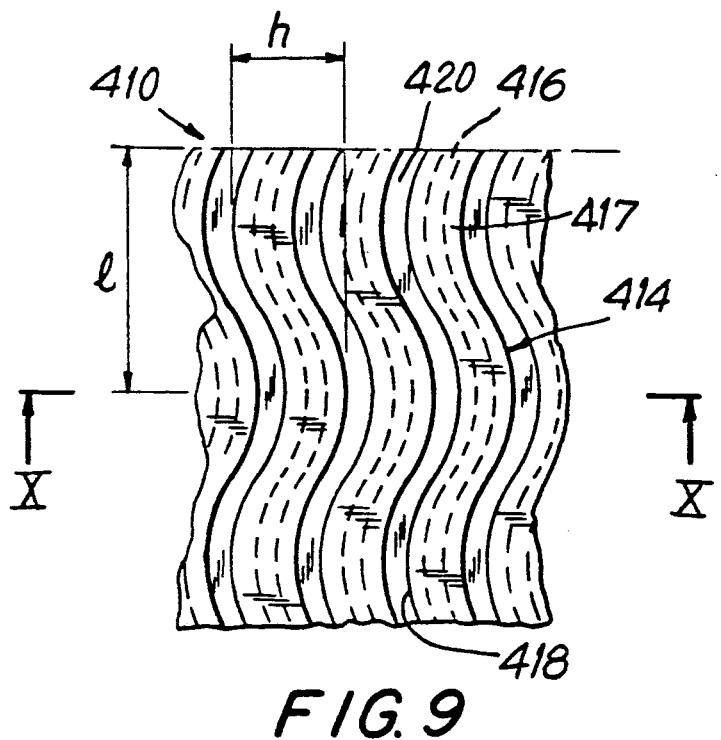
Figure 10:
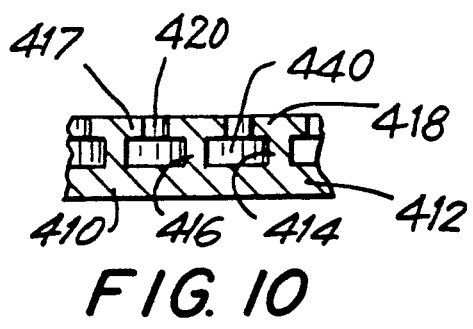

FIG. 9 shows a view in partial section along line IX—IX of FIG. 10, itself constituted by a partial section of a sixth embodiment of a joining system the according to the present invention; and FIG. 10 shows a view in section along line X—X of FIG. 9.

Figure 11:
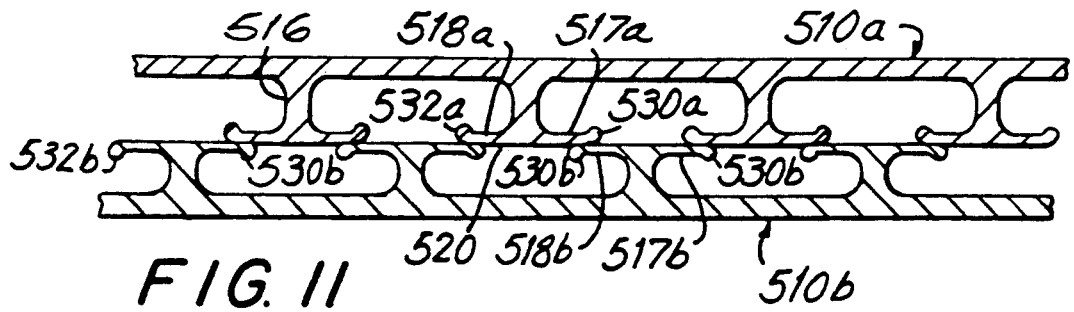

FIG. 11 shows another embodiment of the invention in a schematic view in section similar to that of FIGS. 2, 3, 4a to d, clearly showing that the ends of the lips present a curved edge or an excess thickness, before assembly.

Figure 12:
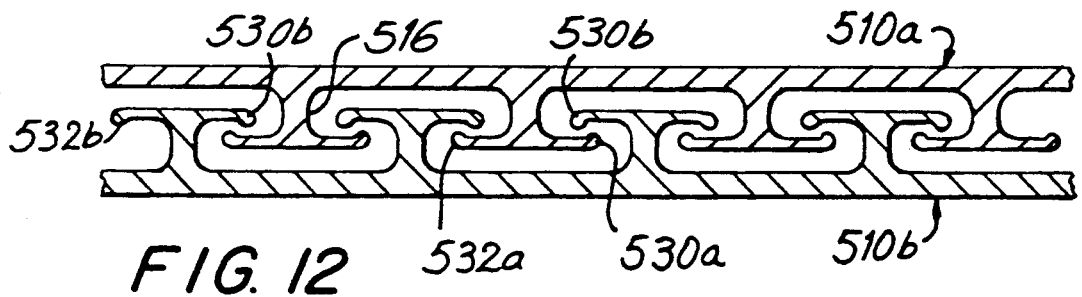

FIG. 12 shows a view similar to FIG. 11 after assembly.

Figure 13:
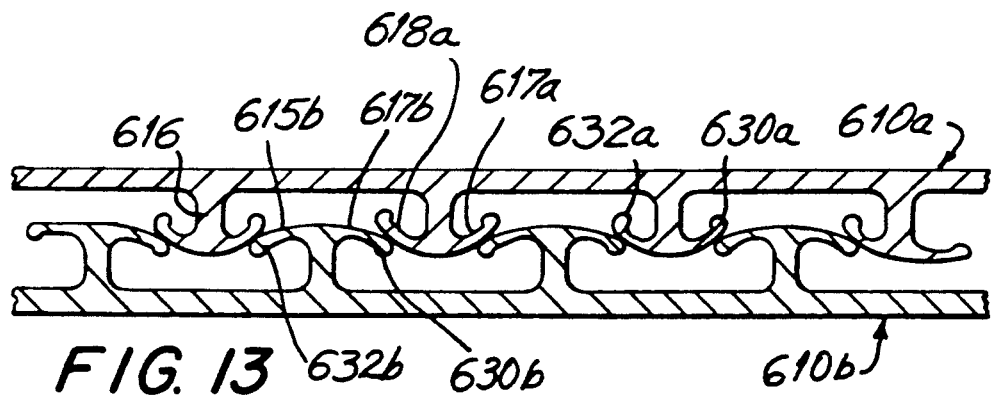

FIG. 13 shows a variant embodiment of a joining system according to the invention likewise with lips presenting at their end a curved edge or an excess thickness, before assembly as in the case of FIG. 11.

Figure 14:
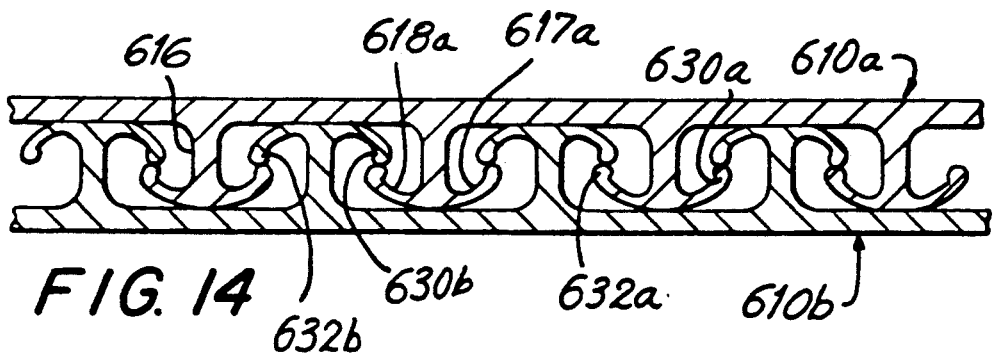

FIG. 14 shows a view similar to FIG. 13, but after assembly.

Figure 1:
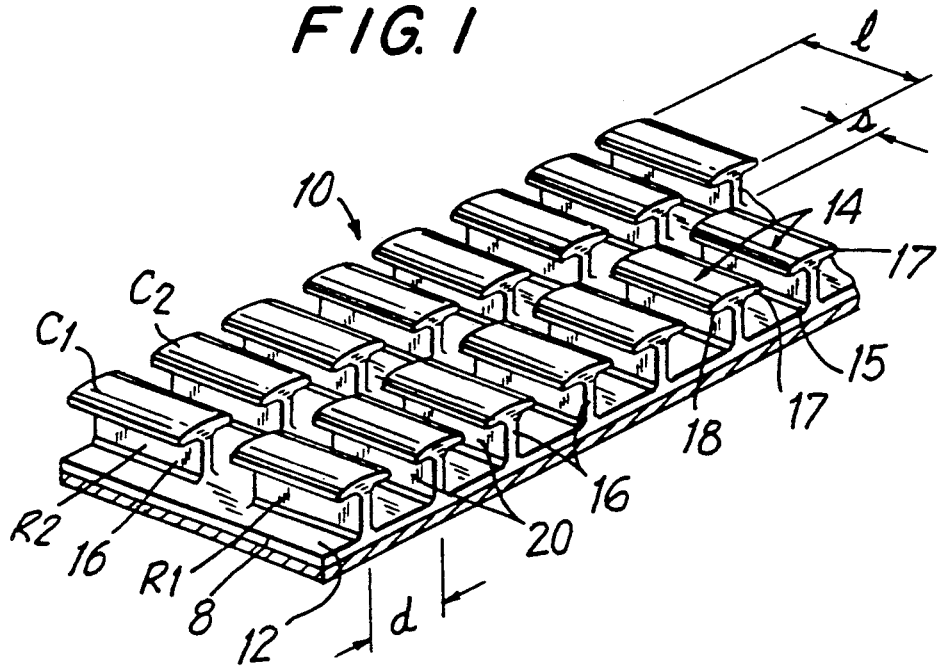
FIG. 1 shows in perspective, in partial section, a joining device according to the invention for system of joining by interengagement.

With reference to FIG. 1, according to a first embodiment of a joining system according to the invention, the latter is formed by two identical joining devices represented by general reference number 10. Each joining device 10 is conventionally in the form of a tape, and is provided on a so-called interengagement face 12 with a plurality of interengaging elements 14, which are at least partly elastically deformable. According to the invention, the interengaging elements 14 are formed by ridges 16 provided with elastically deformable lips 17, 18, projecting on either side of the ridge 16 to define between the lips 17, 18, contractions 20 (and between the ridges 16), of dimension smaller than the projection of the lips 17, 18 of a given ridge.

According to a particular embodiment, as shown in FIG. 1, the ridges 16 are discontinuous. They may also in particular be aligned, as shown in FIG. 1. These aligned discontinuous ridges are therefore to some extent disposed in rows $R_1$, $R_2$, etc... and in columns $C_1$, $C_2$, etc...

Ridges of the same column, for example $C_1$, which are here discontinuous, are separated by notches 22 which thus determine lengths 1 of each individual ridge, the assembly of the rows of ridge determining the length of the joining device in the form of a tape. The dimension of these notches is advantageously less than the length 1 of an individual ridge so as to avoid accidental disassembly. The presence of these notches 22 is beneficial as experience shows that there is no longitudinal slide despite the alignment of the discontinuous ridges 16. It should be noted that the dimension of the notches 22 may be made in a regular pitch, or in an irregular pitch.

Furthermore, the distance between the ridges 16 of successive columns, referenced d, may vary within broad limits which depend on the dimension of the lips 17, 18. However, it is clear that, in order to improve the performances of resistance to disassembly, the total dimension of the ridges 17, 18 must not be too large with respect to the dimension of the ridge. It is preferred that the total surface of the lips 17, 18 be close to the surface of the ridge.

According to a particular embodiment, these ridges 16 are disposed in the longitudinal direction with respect to the interengaging device 10 in tape form, especially when these ridges are discontinuous. These ridges may equally well be disposed in the transverse direction, which will in practice be the case when the ridges are continuous.

According to a particular embodiment, the ridges 16 with their lips 17, 18 are T-shaped in cross section, as shown in FIG. 1. The lips of the T may form a variable angle with respect to the leg of the T defined by the ridge 16 itself. In this example, the lips 17, 18 form an angle of 90° with respect to the ridges 16. In this way, when the ribs are disposed vertically, the lips are disposed substantially horizontally.

It may be provided that each joining device 10 comprises a support layer S which is connected to layer 8 on the face 12 of which are defined the ridges 16.

The support layer S may be made of a material different from layer 8. In addition, the ridges themselves as well as the lips may be made of different materials, which is extremely easy to do in the case of manufacturing the joining device 10 by extrusion.

It is thus understood that these interengaging elements 14 may be made of any material, whether it be question of a plastics material, a metal, a composite material and in particular a composite material such as those described in prior Applications FR-85-19436 and FR-84-14800 or US-4 707 231 mentioned hereinbefore.

Figure 2:
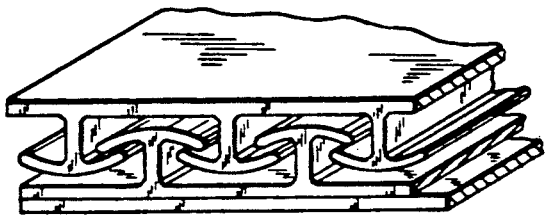
FIG. 2 shows a side view, in elevation, in partial section, of a second embodiment of a joining system according to the invention in assembled position.

FIG. 2 shows a variant embodiment of the lips, with the result that the assembly of the ridges with the lips presents a mushroom section having the lips curved in order to define sections of cylinder whose concavity is turned towards the ridge. It may also be considered here that the lips form an angle smaller than 90° with respect to the ridges.

Figure 3:
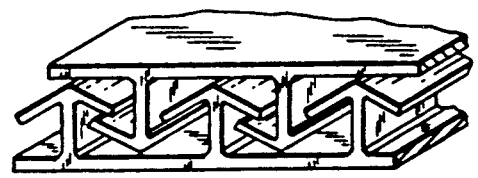
FIG. 3 shows a third embodiment in a view similar to that of FIG. 2, of a joining system according to the invention, in assembled position.

With reference to FIG. 3, another variant embodiment of the lips has been shown, which are substantially plane and which are disposed at an angle close to 45° with respect to the ridges. The assembled positions of FIGS. 2 and 3 make it possible clearly to observe the functioning of the interengaging elements. The resistance to disassembly is increased by the fact that the lips form an angle smaller than 90° with respect to the ridges, as is comprehensible to the man skilled in the art.

With reference to FIGS. 4a to 4d, the process of joining and of disassembly of two identical joining devices according to the invention has been shown. It is question for example of the joining device shown in FIG. 1.

It may be observed that a first joining device A is disposed opposite a second joining device B, with the result that the ridges are offset, preferably by a half-pitch, i.e. by a distance d/2.

Devices A and B are approached so that the respective lips come into contact as shown in FIG. 4b. Approach is continued so as to cause the lips to penetrate by force between the ridges as shown in FIG. 4c. In this way, the system of joining in the assembled state of FIG. 4c is obtained. To effect disengagement or disassembly, it suffices to exert efforts in the direction of the arrows, of a value greater than the value necessary for disengaging the respective lips by elastic deformation thereof as shown in FIG. 4d.

It will naturally be understood that the resistance to elastic deformation of the lips constitutes an important factor for determining the resistance to disassembly and therefore the safety of joining. The lips must therefore be sufficiently elastic to allow a joining or interengagement by force as clearly appears from FIG. 4b whilst being sufficiently rigid to arrive at a sufficiently high resistance to disassembly or disengagement of the whole of the joining system.

This is obtained without problem with any material which presents a capacity of elastic deformation. These materials may be selected from metals, from plastics materials or from composite materials or weaves.

With reference to FIGS. 5a to 5d, a particular process of manufacturing for example the joining device shown in FIG. 1 has been shown.

This process of manufacture comprises the following steps:

a) substantially parallel folds 30, 40 are made in two tapes 32, 42, with the aid of any appropriate pleating or folding means, such as rollers comprising ribs whose height is a function of the desired depth of the fold 30 or 40.

The folded tapes are shown in FIG. 5a.

Such a folding may be very easily effected hot when the tapes 32, 42 are made of thermoformable plastics material.

b) these two tapes 32, 42 are disposed at a predetermined distance from each other with the respective folds opposite, but offset, which is also shown in FIG. 5a.

c) the two tapes 32, 42 are approached until the edges of the folds 30, 40 are in contact with the other tape as shown in FIG. 5b.

d) the edges, or the apices, of the folds 30, 40 are connected with the tape 32 or 42 with which they are in contact by any appropriate means, such as welding or gluing, the points of connection being referenced for example 44 on tape 42 and 46 on tape 32, as also shown in FIG. 5b.

e) finally, cut-outs 50 are made between the folds 30, 40 on only one of the two tapes. Such cut-outs are therefore made at a pitch which is a quarter of the pitch of the initial folds 30 or 40 and so as always to lie between folds 30 and 40. It is ascertained that the folds 30 are hollow. They may be obturated by any material and in particular a material of the same nature as the material constituting the initial tape 32.

According to a variant embodiment, another tape forming support S may be connected on tape 42 opposite the tape 32 comprising the cut-outs or intended to comprise the cut-outs 50, as shown in FIG. 5d, for example a weave.

According to this process of manufacture, an extremely easy manufacture of the joining devices is obtained, at an extremely low cost. This process of manufacture may be carried out continuously without any problem at a very high rate, in totally automatized manner.

FIG. 6 shows another embodiment of the interengaging elements according to the invention here referenced 114. According to a first variant shown in the left-hand part of FIG. 6, the interengaging elements 114 are made in the form of continuous ridges disposed transversely to the interengagement device 100. In the right-hand part of FIG. 6, a variant embodiment has been shown in which the ridges 214a, 214b are discontinuous whilst being disposed edge to edge but offset. In particular, according to the particularly advantageous embodiment shown in the right-hand part of FIG. 6, the ridges 214b are offset by a half-pitch with respect to the ridges 214a, or are disposed in quincunx. This arrangement is very advantageous for preventing a slide in the longitudinal direction of the ridges after assembly of two identical joining devices 100.

With reference to FIGS. 7 and 8, reference numbers have been used which are identical to those used in FIG. 1, increased by 300, for parts which are identical or of identical function. In this way, the joining system according to the invention is formed by two joining devices represented by general reference number 310a, 310b. Each joining device 310a, 310b is conventionally in the form of a tape and is provided on one face 312a, 312b with a plurality of interengaging elements 314a, 314b. These interengaging elements 314a, 314b are formed by ridges 316a, 316b, provided with elastically deformable lips 317a, 318a; 317b, 318b, projecting on either side of the ridges 316 to define between the lips 317a, 318a; 317b, 318b, contractions 320a, 320b of dimension smaller than the projection of the lips 317a, 318a; 317b, 318b of a given ridge.

According to the present invention, the ridges 316a, 316b have a curvilinear section which is clearly visible in FIG. 7.

According to a particular embodiment as shown in FIGS. 7 and 8, the ridges 316a, 316b have an arcuate section. And, according to a variant embodiment, these ridges 316a, 316b are continuous. Consequently, each ridge 316a, 316b forms a circle, the ridges being disposed concentrically, therefore having a different radius, as is clearly visible and comprehensible to the man skilled in the art from FIGS. 7 and 8.

It is also possible, according to another variant embodiment, to make ridges 316a, 316b discontinuous.

It will be observed that, according to this embodiment of FIGS. 7 and 8, each joining device 310a, 310b may advantageously present the shape of a disc. In that case, in order to facilitate joining, it may be advantageous if one of the two joining devices 310a, 310b comprises at least one centering stud 330, for example here made at the centre of the disc of the joining device 310b cooperating with a through orifice 332 of the other joining device 310a, likewise made at its centre in the case of a disc. It will be observed furthermore that it may be advantageous if one of the two devices (here device 310a) has a smaller dimension in order to fit completely in the other device, as clearly visible and comprehensible on considering FIG. 8.

For the device of larger dimension, such as 310b, FIG. 2, it may be provided that the outermost ridges comprise only one lip, as shown in FIG. 8, directed towards the interior of the device, and no lip directed outwardly, this from a standpoint of total projection and also of aesthetic aspect.

It will be understood that, with this fifth embodiment of the invention shown in FIGS. 7 and 8, any longitudinal displacement of the interengaging devices 310a, 310b with respect to each other is prevented. On the other hand, a displacement in rotation through 360° is allowed, which may be advantageous for certain applications. This displacement in rotation may be limited to a lower value, by providing stops formed by transverse partitions connecting the ridges if this proved necessary for certain particular applications.

With reference to FIGS. 9 and 10, a sixth embodiment of a joining system according to the invention has been shown, in a view from above and in partial section of one of the two devices, the two devices being in that case preferably of identical shape. For this second embodiment, the same reference numerals increased by a further 100 have been used.

In this way, the interengagement device such as 410 comprises interengaging elements 414 formed by curvilinear ridges 416 provided with elastically deformable lips 417, 417 projecting on either side of the ridges 416 to define between the lips 417, 418 of two successive ridges, contractions 420 of dimension smaller than the projection of the lips 417, 418 of a given ridge 416.

According to this sixth embodiment of FIGS. 9 and 10, these ridges present a sinusoidal section clearly visible in FIG. 9.

It may thus be ascertained that, with such a joining system, any longitudinal slide of the two joining devices 410 with respect to each other is avoided, whilst also preventing a rotation of one interengagement device with respect to the other, which is advantageous in certain particular applications.

The process for manufacturing a system of joining as described hereinbefore with reference to FIGS. 7 to 10 is characterized in that two tapes of extrudable material with ridges of curvilinear section are extruded.

In the particular case of FIGS. 9 and 10, where ridges of sinusoidal section are made, the joining devices 410 are manufactured by using two extrusion dies, a fixed die corresponding to the negative part 440 (FIG. 2) and a mobile die downstream of the fixed die which is displaced in reciprocating manner in the direction perpendicular to the advance of the tape, whilst the extrudable material is still soft. Naturally, the mobile die acts only at the level of the ridges 416 and the associated lips 417, 418, whilst the base or sole 412 is obviously not touched by the mobile die. As extrudable material, any thermoplastics material well known to the man skilled in the art may be used.

It will be understood that the length of the relative horizontal displacement of the mobile die with respect to the fixed die will give the height of the sinusoids h, FIG. 9, whilst the frequency of oscillation of the mobile die with respect to the fixed die will give the length of a sinusoid or period 1. It will be immediately understood that the joining device of the type of device 410 is assembled extremely simply whilst preventing any displacement in the longitudinal direction even when one pulls strongly and inversely on the two joining devices in assembled position by interengagement. All the determining technical advantages previously set forth are thus obtained.

With reference to FIGS. 11 and 12, yet another embodiment of a joining system according to the invention has been shown, for which the reference numerals have been increased by a further 100 with respect to the preceding embodiment, wherein the lips 517a, 518a; 517b, 518b of the first joining device 510a and of the second joining device 510b, respectively comprise at their end a curved nose 530a, 532a and 530b, 532b, respectively. This curved nose may be replaced by an inner excess thickness at the end of the lips. The curved nose or the inner excess thickness serve as point of resistance against disassembly as is well comprehensible from the assembled position shown in FIG. 12.

Similarly, according to another variant embodiment shown in FIGS. 13 and 14, for which the reference numerals have been further increased by 100, it is observed that the lips 617a, 618a; 617b, 618b comprise an inner excess thickness 630a, 632a; 630b, 632b, or a nose curved towards the ridge, serving as point of resistance against disassembly.

It will further be observed that, in the variant embodiment of FIGS. 13 and 14, the general section of the lips of a given ridge is curved in the direction of the ridge, the lip-ridge assembly thus having the approximate shape of a mushroom.

In all the preceding embodiments, it is preferred according to the invention that the ratio in percentage of the thickness of the lips to the thickness of the ridges is included between 20–30 and 70–80, preferably between 20–30 and 60–70.

It is thus understood that all the determining technical advantages, unexpected and not obvious for a man skilled in the art, set forth hereinbefore, are obtained.

The applications of the joining system according to the invention are numerous and may be principally defined as follows:

A) - For current applications

The joining system may be carried out for manufacture of the "extruded" type in plastics or thermoplastics material by hot shaping, at an extremely low cost price and with average precision.

The essential applications are: sewing, conventional fasteners of the "Velcro" type, the fixation of linings, stationery, cheap decoration, etc...

A precise embodiment is as follows: an elastomer such as neoprene is used as material. The interengagement devices 10 are made of neoprene by hot shaping.

The dimension of the ridges 16 is 0.5 mm thickness for a height of 3 mm, whilst the lips 17, 18 have a thickness of 0.30 mm and a width of 1.50 mm.

The section is a straight "T", the assembly of the lips and ridges thus being included in an equilateral triangle with sides measuring 3 mm.

These interengaging elements 14, by the ridges 15 and the lips 17, 18, are integral with a tape 16 forming sole 0.5 mm thick.

The total dimension of the joining device may represent a total surface of 1 to 3 cm$^2$ for example in order easily to replace a button.

A lid of the dustbin lid or recipient type may be equipped by connection of a circumferential tape constituted by this interengagement device 10.

B) - Fairly sophisticated applications

It is question for example of furnishings, wall hangings, decoration, stands, the interior of automobiles, etc...

A particularly interesting application is the decoration of ceilings, as, with the system of interengagement according to the invention comprising two identical joining devices 10, there is no thermal nor dynamic ageing, therefore no separation, and applications subjected to gravity behave very well with the joining system according to the invention, which presents a very high resistance to pulling apart or to disassembly, which may be pulled very largely as a function of the nature of the material used for making the ridges and the lips.

C) High technology applications

All scientific applications may be mentioned: in laboratories, aeronautics, space, electrical, sound and heat insulations, etc...

By way of example, a noteworthy use of the system of interengagement according to the invention may be mentioned, for producing the interior of aircraft, which may be made of fire-proof partitions with composite materials which are themselves fireproof and fixed by interengagement in accordance with the system of joining by interengagement according to the invention, thus avoiding the use of glues which are often the object of toxic fumes in the event of fire.

The invention may be used in public works in particular for making systems of joining with antennas, cranes, ...

It should be noted that the embodiment of FIGS. 7 and 8 is particularly interesting when an interengagement is desired which allows a considerable freedom of movement through 360°, as in the case of interengagements of underwear, nappies, etc.. in order not to hinder movement of the legs by a fixed lock. The invention makes it possible to make a reciprocating or continuously rotating displacement of the joining devices with respect to one another in assembled position by interengagement. Other examples on the industrial scale may be mentioned, where a movement of freedom in rotation at the same time as a serious fastening are required, such as: removable tarpaulins, hoops of mobile objects, etc...

It will thus be understood that the invention comprises all the means constituting technical equivalents of the means described as well as their various combinations without departing from the scope of the invention.

We claim:

1. A system of joining by interengagement, suitable for fasteners by interengagement, comprising;
    a first joining device conventionally in the form of a tape, provided on a first interengagement face having a plurality of first interengaging elements which are at least partly elastically deformable, and
    a second joining device also conventionally in the form of a tape, provided on a second interengagement face with a plurality of second interengaging elements which are least partly elastically deformable,
    wherein said interengaging elements comprise ridges having a bottom portion secured to said interengagement face and a top portion provided with lips projecting on either side of said ridges having a given length to define free ends and there being between said lips of two adjacent ridges gaps of a dimension smaller than the projection of said lips of a given ridge, said ridges being substantially non-elastically deformable during interengagement or disengagement by force on the interengaging elements, and said lips having a substantially constant thickness on a major part of their length, said free ends of said lips having a thickness which is at least that of the major part of said lips and being elastically bendable during the interengagement or disengagement by force on said interengaging elements.

2. The system defined in claim 1, wherein said ridges are of a thickness greater than the thickness of said lips.

3. The system defined in claim 2, wherein the ratio in percentage between the thickness of said lips and the thickness of said ridges is between about 20 and 80.

4. The system defined in claim 3, wherein said ratio is between about 20 and 70.

5. The system defined in claim 1, wherein the total surface of said lips surrounding a given ridge is substantially identical to the surface of said ridge.

6. The system defined in claim 1, wherein said lips and said ridges are included in an equilateral triangle.

7. The system defined in claim 1, wherein said ridges are discontinuous.

8. The system defined in claim 7, wherein said ridges are aligned and are separated by gaps having a dimension smaller than the length of said ridges.

9. The system defined in claim 7, wherein said ridges are offset.

10. The system defined in claim 1, wherein said interengaging elements are disposed in a plurality of rows separated by gaps, said gaps being of a size smaller than the length of said ridges.

11. The system defined in claim 10, wherein adjacent rows of said interengaging elements are disposed in said rows aligned with respect to one another.

12. The system defined in claim 10, wherein adjacent rows of said interengaging elements are disposed in said rows offset with respect to one another.

13. The system of joining according to claim 1, wherein the said interengagement elements are made of a material selected from the group consisting of a metal, a plastic material, or a composite material.

14. The system defined in claim 1, wherein said ridges have a curvilinear section.

15. The system defined in claim 1, wherein said ridges have an arcuate section and are advantageously concentric.

16. The system defined in claim 1, wherein the ridges have a sinusoidal section.

17. The system defined in claim 1, wherein the ridges with their lips have a T-shaped cross section, the lips forming with the ridges an angle equal to not more than about 90 degrees.

18. The system defined in claim 1, wherein the general section of the lips of a given ridge is curved in the direction of the ridge.

19. The system defined in claim 1, wherein the end of said lips comprises a nose curved toward the ridge and serves as point of resistance against disassembly.

20. The system defined in claim 1, wherein said end of lips comprises an inner excess thickness serving as point of resistance against disassembly.

* * * * *